United States Patent
Cho et al.

(10) Patent No.: US 8,432,599 B2
(45) Date of Patent: Apr. 30, 2013

(54) OPTICAL IMAGE MODULATOR AND METHOD OF MANUFACTURING THE SAME

(75) Inventors: Yong-Chul Cho, Suwon-si (KR);
Yong-Tak Lee, Gwangju (KR);
Yong-Hwa Park, Yongin-si (KR);
Byung-Hoon Na, Seoul (KR);
Bong-Kyu Jeong, Seoul (KR)

(73) Assignees: Samsung Electronics Co., Ltd., Suwon-si (KR); Gwangju Institute of Science and Technology, Gwangju (KR)

( * ) Notice: Subject to any disclaimer, the term of this patent is extended or adjusted under 35 U.S.C. 154(b) by 129 days.

(21) Appl. No.: 13/167,486

(22) Filed: Jun. 23, 2011

(65) Prior Publication Data
US 2012/0140309 A1 Jun. 7, 2012

(30) Foreign Application Priority Data
Dec. 3, 2010 (KR) .................. 10-2010-0122678

(51) Int. Cl.
*G02F 1/03* (2006.01)
*G02F 1/29* (2006.01)
*H01S 5/00* (2006.01)

(52) U.S. Cl.
USPC ........... 359/248; 359/245; 359/260; 359/315; 359/318; 359/344; 372/43.01; 372/45.01; 372/50.1; 372/50.11; 372/50.124

(58) Field of Classification Search ........... 359/245, 359/248–250, 344; 372/43.01, 44.01, 50.1, 372/50.11, 50.124; 257/80, 103, E31.032, 257/E33.028, E33.069; 438/14, 39, 46, 72
See application file for complete search history.

(56) References Cited

U.S. PATENT DOCUMENTS

| | | | |
|---|---|---|---|
| 4,525,687 A | 6/1985 | Chemla et al. | |
| 5,408,486 A * | 4/1995 | Shoji | 372/45.01 |
| 5,426,312 A | 6/1995 | Whitehead | |
| 6,154,299 A | 11/2000 | Gilbreath et al. | |
| 6,331,911 B1 | 12/2001 | Manassen et al. | |
| 6,803,604 B2 * | 10/2004 | Takahashi et al. | 257/80 |
| 7,196,349 B2 | 3/2007 | Alavi et al. | |
| 7,368,316 B2 * | 5/2008 | Yokouchi et al. | 438/98 |
| 7,391,800 B2 * | 6/2008 | Takahashi | 372/50.1 |

(Continued)

FOREIGN PATENT DOCUMENTS
JP 2004-280018 A 10/2004
JP 2005-223043 A 8/2005

OTHER PUBLICATIONS

Liu, H. "High Speed, Low Driving Voltage Vertical Cavity MQW Modulators for Optical Interconnect and Communication" Mar. 2001, pp. 1-134.

(Continued)

*Primary Examiner* — Loha Ben
(74) *Attorney, Agent, or Firm* — Sughrue Mion, PLLC (57) ABSTRACT

An optical image modulator and a method of manufacturing the same. The optical image modulator includes a substrate, an N electrode contact layer formed on the substrate, a lower distributed Bragg reflection (DBR) layer, a quantum well layer, an upper DBR layer, and a P electrode contact layer sequentially stacked on the N electrode contact layer, a P electrode formed on the P electrode contact layer, and an N electrode formed on the N electrode contact layer. The N electrode is a frame that surrounds the lower DBR layer.

23 Claims, 7 Drawing Sheets

U.S. PATENT DOCUMENTS

| | | | |
|---|---|---|---|
| 7,719,746 | B2 | 5/2010 | Goetz et al. |
| 7,778,297 | B2 * | 8/2010 | Kageyama et al. ........ 372/43.01 |
| 8,031,754 | B2 * | 10/2011 | Iwai et al. ................ 372/50.124 |
| 8,279,519 | B2 * | 10/2012 | Takahashi et al. ............ 359/344 |
| 2002/0076187 | A1 | 6/2002 | Coult et al. |
| 2010/0271690 | A1 * | 10/2010 | Kawakita et al. ............. 359/344 |

OTHER PUBLICATIONS

Liu, H. et., al. "High-speed, dual-function vertical cavity multiple quantum well modulators and photodetectors for optical interconnects", Society of Photo-Optical Instrumentation Engineers, Jul. 2001, vol. 40, No. 7, pp. 1186-1191.

Arad, U. et., al. "Development of a Large High-Preformance 2-D Array of GaAs—AlGaAs Multiple Quantum-Well Modulators", IEEE Photonics Technology Letters, vol. 15, No. 7, Nov. 2003, pp. 1531-1533.

Goossen, K. W. et. ,al. "Electroabsorption in ultranarrow-barrier GaAs/AlGaAs multiple quantum well modulators", Appl. Phys. Lett., vol. 64, No. 9, Feb. 28, 1994, American Institute of Physics, pp. 1071-1073.

* cited by examiner

OPTICAL IMAGE MODULATOR AND METHOD OF MANUFACTURING THE SAME

CROSS-REFERENCE TO RELATED APPLICATIONS

This application claims the benefit of Korean Patent Application No. 10-2010-0122678, filed on Dec. 3, 2010, in the Korean Intellectual Property Office, the disclosure of which is incorporated herein in its entirety by reference.

BACKGROUND

1. Field

The present disclosure relates to optical elements, and more particularly, to optical image modulators having a PIN diode structure and methods of manufacturing the optical image modulators.

2. Description of the Related Art

In order to use a gallium arsenide (GaAs)-based optical image modulator in a three-dimensional (3D) camera, optical modulation should be able to occur at high speed over an aperture having an area of more than, for example, 4 mm×3 mm, at a frequency of several tens of MHz. An optical image modulator includes a resistance component and a capacitance component (a parasitic capacitance component). Accordingly, in order to perform optical modulation at high speed in the optical image modulator, a time constant (RC) should be small.

A resistance component included in an optical image modulator having a PIN diode includes a contact resistance between a metal that is an electrode material and a semiconductor material, a sheet resistance of each electrode contact layer, and a vertical resistance of a distributed Bragg reflection (DBR) layer. From among the resistances, the sheet resistance of the electrode contact layer is the highest. As an attempt to reduce sheet resistances of a P electrode and an N electrode in an optical image modulator having a PIN diode, there has been suggested an optical image modulator in which a fishbone-typed electrode is formed on an electrode contact layer, and a fishbone pitch is kept small in consideration of a ratio of the sheet resistance of the P electrode contact layer to the sheet resistance of the N electrode contact layer, and in consideration that a sheet resistance of an N electrode contact layer and a line resistance of a metal line of the P electrode are increased farther away from a bonding pad.

However, in such an optical image modulator, if a sheet resistance of the N electrode is about ⅕ of a sheet resistance of the P electrode, the fishbone pitch is further reduced and thus a metal shadow is increased due to a portion with the further reduced fishbone pitch, thereby reducing a light reflectance.

Meanwhile, a sheet resistance of the N electrode contact layer may be further reduced by doping silicon (Si) on the N electrode contact layer to reduce a sheet resistance of the N electrode contact layer to about ⅕ of that of the P electrode and increasing a silicon doping density. However, when the silicon doping density on the N electrode contact layer is increased to a predetermined level, the quality of the N electrode contact layer may be greatly reduced, the sheet resistance of the N electrode contact layer may be rather increased, and a breakdown voltage may be reduced. Hence, when the fishbone pitch in the P electrode is constant, a sheet resistance of the N electrode contact layer is increased farther from the bonding pad. Accordingly, a time constant of the optical image modulator may be increased, thereby making it difficult to drive the optical image modulator at high speed.

SUMMARY

Provided are optical image modulators that may operate at high speed and have uniform frequency response characteristics.

Provided are optical image modulator arrays (i.e., large optical image modulators) including the optical image modulators as unit optical image modulators.

Provided are methods of manufacturing the optical image modulators.

Additional aspects will be set forth in part in the description which follows and, in part, will be apparent from the description, or may be learned by practice of the presented embodiments.

According to an aspect of exemplary embodiments, an optical image modulator includes: a substrate; an N electrode contact layer formed on the substrate; a lower distributed Bragg reflection (DBR) layer formed on the N electrode contact layer; a quantum well layer formed on the lower DBR layer; an upper DBR layer formed on the quantum well layer; a P electrode contact layer formed on the upper DBR layer; a P electrode formed on the P electrode contact layer; and an N electrode formed on the N electrode contact layer, wherein the N electrode is a frame that surrounds the lower DBR layer.

The P electrode and the N electrode may be respectively connected to a P electrode bonding pad and an N electrode bonding pad, and the P electrode bonding pad and the N electrode bonding pad may be arranged in the same direction to be parallel to each other.

The P electrode may be formed in a fishbone pattern or a matrix pattern.

The optical image modulator may further include an insulating layer that surrounds the N electrode contact layer, the lower DBR layer, the quantum well layer, the upper DBR layer, and the P electrode contact layer, wherein a through-hole through which a portion of the N electrode contact layer is exposed is formed in the insulating layer, wherein the N electrode is formed on the portion of the N electrode contact layer exposed through the through-hole.

The N electrode may surround at least one side of the lower DBR layer.

The optical image modulator may further include a second N electrode bonding pad connected to the N electrode, wherein the N electrode bonding pad and the second N electrode boding pad are symmetric to each other about the P electrode bonding pad.

A width of the N electrode may be increased farther away from a point where a voltage of the N electrode is applied.

The width of the N electrode may be increased continuously or stepwise (discontinuously).

An N electrode pad and a P electrode pad may be arranged in the same direction on the insulating layer, and the N electrode may be extended along a side wall of the through-hole to be connected to the N electrode.

According to another aspect of the present invention, there is provided an optical image modulator array including: an array of unit optical image modulators; and a plurality of driving elements that control driving voltages applied to the unit optical image modulators, wherein each of the unit optical image modulators is the optical image modulator.

The unit optical image modulators may be arranged in 2 columns and in Y rows (Y=1, 2, 3, . . . ).

The plurality of driving elements may correspond to the unit optical image modulators in a one-to-one manner.

The plurality of driving elements may be arranged in 2 columns, that is, one column at either side of the plurality of unit optical image modulators, and the number of rows in each of the 2 columns may be equal to the number of rows of the unit optical image modulators.

Lengths of electric wires between the driving elements and the unit optical image modulators may be the same.

According to another aspect of exemplary embodiments, a method of manufacturing an optical image modulator includes: forming an N electrode contact layer on a substrate; sequentially stacking a lower DBR layer, a quantum well layer, an upper DBR layer, and a P electrode contact layer on the N electrode contact layer; forming a mask on a portion of the P electrode contact layer; sequentially etching in reverse order the lower DBR layer, the quantum well layer, the upper DBR layer, and the P electrode contact layer by using the mask as an etching mask until a portion of the N electrode contact layer is exposed; removing the mask; forming an insulting layer on the substrate to cover the exposed portion of the N electrode contact layer and to cover side surfaces of the lower DBR layer, the quantum well layer, the upper DBR layer, and the P electrode contact layer; forming a through-hole in the insulating layer to expose a portion of the N electrode contact layer and to surround the lower DBR layer; and forming a P electrode on the P electrode contact layer, and forming an N electrode on the portion of the N electrode contact layer exposed through the through-hole to surround the lower DBR layer.

The forming of the P electrode and the N electrode may include forming on the insulating layer a P electrode bonding pad to be connected to the P electrode and an N electrode bonding pad to be connected to the N electrode, wherein the P electrode bonding pad and the N electrode bonding pad are formed in the same direction to be parallel to each other.

The P electrode may be formed in a fishbone pattern or a matrix pattern.

The N electrode may have a width that is increased farther away from the N electrode bonding pad.

One or two N electrode bonding pads may be used.

The width of the N electrode may be increased continuously or stepwise (discontinuously).

An optical image modulator according to one or more embodiments includes an N electrode frame that surrounds a PIN diode structure layer as an N electrode on an N electrode contact layer. Accordingly, as paths of current supplied to regions of a contact layer from an electrode are shortened and constant, a time constant of the optical image modulator is reduced. As a result, the optical image modulator may operate at a high frequency of several tens of MHz, for example, 40 MHz or more, and a parasitic capacitance of the optical image modulator may be lower than that of a conventional case that does not include such an N electrode frame.

Also, since the N electrode frame has a width that is increased farther away from an N electrode pad to compensate for an increase in a line resistance as a length of the N electrode frame is increased, the optical image modulator may have uniform frequency response characteristics.

Also, since unit optical image modulators and driving elements of an optical image modulator array are arranged in a one-to-one manner and lengths of electric wires between the unit optical image modulators and the driving elements are the same, the unit optical image modulators constituting the optical image modulator array may have uniform frequency response characteristics and the optical image modulator array may have uniform frequency response characteristics.

Also, the optical image modulator may operate at a low voltage, for example, 6 V or less, may turn on or off input light by controlling a bias voltage applied to the P electrode and the N electrode, and a time-of-flight (TOF) based on a phase delay through square or sine wave amplitude modulation performed on an input light signal may be calculated.

Also, the optical image modulator may be located at a front end of a charged coupled device (CCD) or a complementary metal oxide semiconductor (CMOS), and may measure a distance (a phase delay) by using a driving signal, which is obtained by modulating or mixing input light incident on a camera, and a TOF.

Also, instead of an image intensifier that is expensive and has a large volume, the optical image modulator may be applied to a three-dimensional (3D) image capturing device in real life, a robot for recognizing 3D environment, a laser radar for military purposes, an input device for 3D display, and a device for measuring a 3D shape.

Also, since most 3D cameras that are currently available adopt an internal modulation and demodulation method in a CCD, the 3D cameras have low resolution. Furthermore, since a signal processing circuit is disposed around pixels in a unit element, sizes of unit pixels are increased, thereby making it difficult to manufacture 3D cameras with high resolution. However, since the optical image modulator using photoelectric absorption may use an existing CCD or CMOS as it is, it is easy for the optical image modulator to have high resolution.

Also, the optical image modulator may be used for an attenuator that reduces the intensity of light to a predetermined level, and also may be used for an optical communication system using amplitude modulation, an optical operator in an optical computer, and an array for optical signal processing.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Exemplary embodiments will now be described more fully with reference to the accompanying drawings, in which exemplary embodiments of the invention are shown. In the drawings, thicknesses of layers or regions are exaggerated for clarity.

Figure 1:
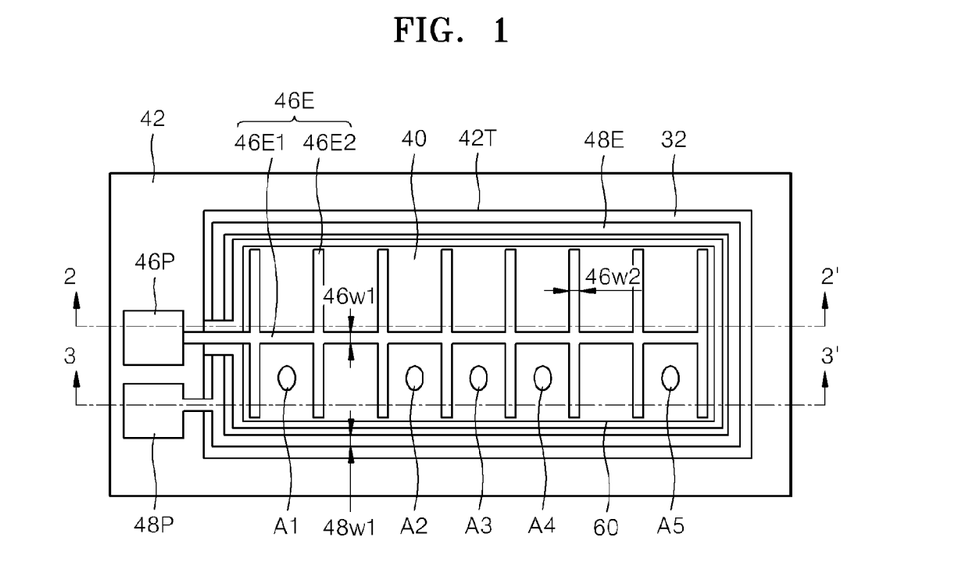
FIG. 1 is a plan view of an optical image modulator according to an embodiment.

An optical image modulator will be first explained. FIG. 1 is a plan view of an optical image modulator according to an embodiment.

Referring to FIG. 1, an insulating layer 42 surrounds a PIN diode structure layer 60 of the optical image modulator. A size of the PIN diode structure layer 60 may be, for example, 2 mm×1 mm. A through-hole 42T which surrounds the PIN diode structure layer 60 having a rectangular shape and through which a portion of a top surface of an N electrode contact layer 32 is exposed is formed in the insulating layer 42. An N electrode frame 48E is formed on the portion of the N electrode contact layer 32 exposed through the through-hole 42T to surround the PIN diode structure layer 60. The N electrode frame 48E is connected to an N electrode pad 48P formed on the insulating layer 42. The N electrode frame 48E may have a single or multi-layer structure. If the N electrode frame 48E has a multi-layer structure, the N electrode frame 48E may be formed by stacking, for example, a nickel (Ni) layer, a gold (Au) layer, and a germanium (Ge) layer. A width 48$w$1 of the N electrode frame 48E may be equal to or greater than, for example, 10 μm, and preferably may be 20 to 80 μm. A P electrode 46E is disposed on a P electrode contact layer 40 of the PIN diode structure layer 60. The P electrode 46E, which is a metal line, includes a first electrode 46E1 and a second electrode 46E2. The first electrode 46E1 called a bus-bar is formed to extend from one end to the other end of the P electrode contact layer 40 in a longitudinal direction of the PIN diode structure layer 60. The first electrode 46E1 is extended and connected to a P electrode pad 46P formed on the insulating layer 42. A plurality of the second electrodes 46E2 which are metal lines are arranged in a direction perpendicular to the first electrode 46E1. The second electrodes 46E2 are arranged at regular intervals. As a result, the first and second electrodes 46E1 and 46E2 are arranged in a fishbone pattern. The first electrode 46E1 passes through the through-hole 42T to be connected to the P electrode pad 46P. The insulating layer 42 is disposed under the first electrode 46E1 passing through the through-hole 42T. Each of the first and second electrodes 46E1 and 46E2 may have a single or multi-layer structure. If each of the first and second electrodes 46E1 and 46E2 has a multi-layer structure, each of the first and second electrodes 46E1 and 46E2 may be formed by stacking, for example, a platinum (Pt) layer, a titanium (Ti) layer, and a gold (Au) layer. In order to increase a fill factor, each of the first and second electrodes 46E1 and 46E2 may be a transparent electrode formed of indium tin oxide (ITO), zinc oxide (ZnO), or aluminum zinc oxide (AZO). Each of widths 46$w$1 and 46$w$2 of the first and second electrodes 46E1 and 46E2 may be, for example, 10 to 20 μm. The P electrode 46E may be configured in a matrix pattern instead of a fishbone pattern. The P electrode pad 46P and the N electrode pad 48P may be disposed on a side of the insulating layer 42 to be parallel to each other.

Meanwhile, the N electrode frame 48E may be disposed to surround only a part of the PIN diode structure layer 60. For example, the N electrode frame 48E may surround one side, or a first side and a second side perpendicular to the first side of the PIN diode structure layer 60.

Figure 2:
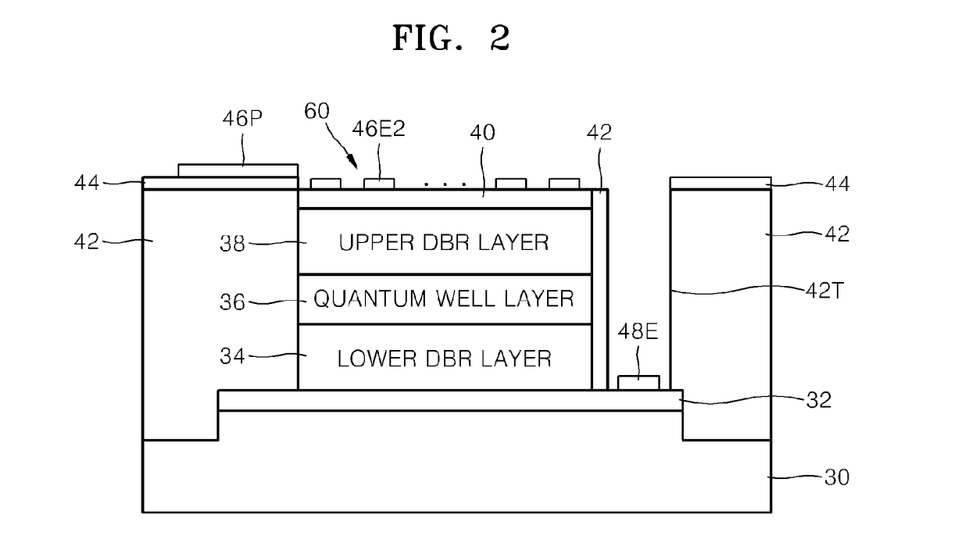
FIG. 2 is a cross-sectional view taken along line 2-2' of FIG. 1.

FIG. 2 is a cross-sectional view taken along line 2-2' of FIG. 1.

Referring to FIG. 2, the N electrode contact layer 32 is formed on a substrate 30. The substrate 30 may be, for example, a gallium arsenide (GaAs) substrate. The N electrode contact layer 32 may be a compound semiconductor layer, for example, an n-doped GaAs layer. The PIN diode structure layer 60 is formed on a portion of the N electrode contact layer 32. The PIN diode structure layer 60 includes a lower distributed Bragg reflection (DBR) layer 34, a multiple quantum well layer 36, and an upper DBR layer 38 which are sequentially stacked. The P electrode contact layer 40 is disposed on the upper DBR layer 38. The P electrode contact layer 40 may be a compound semiconductor layer, for example, a p-doped GaAs layer. The lower DBR layer 34 may include a plurality of n-doped compound semiconductor layers. For example, the lower DBR layer 34 may include a plurality of material layer pairs which are sequentially stacked. In this case, the material layer pairs have different refractive indices, each of the material layer pairs includes two material layers which are sequentially stacked, and the two material layers may be, for example, n-doped AlGaAs layers. In this case, composition ratios of the two material layers may be different from each other. The upper DBR layer 38 may include a plurality of p-doped compound semiconductor layers. The layers of the upper DBR layer 38 may be similar in configuration to those of the lower DBR layer 34. However, the number of the material layer pairs included in the upper DBR layer 38 may be less than that of the lower DBR layer 34. An optical thickness of each of the material layers of the material layer pairs included in the upper and lower DBR layers 38 and 34 satisfies $\lambda/4$. Here, $\lambda$ is a wavelength of incident light. The multiple quantum well layer 36 in which photoelectric absorption occurs may include an undoped intrinsic compound semiconductor layer. For example, the multiple quantum well layer 36 may include a plurality of pairs including compound semiconductor layers. In this case, each of the pairs may include a compound semiconductor layer having a quantum well and a compound semiconductor layer acting as a barrier. The compound semiconductor layer having the quantum well may be, for example, a GaAs layer. The compound semiconductor layer acting as the barrier may be, for example, $Al_{0.31}Ga_{0.69}As$ layer having a high energy band gap. The quantum well layer 36 disposed between the upper and lower DBR layers 38 and 34 forms a cavity. A thickness of the quantum well layer 36 may be an integer multiple of $\lambda/2$. The second electrodes 46E2 constituting the P electrode 46E are disposed on the P electrode contact layer 40 at regular intervals. The PIN diode structure layer 60 is surrounded by the insulating layer 42. When a plurality of optical image modulators are arranged as an array, the insulating layer 42 electrically separates the optical image modulators. The insulating layer 42 may be, for example, benzocyclobutene (BCB) layer. A portion of the N electrode contact layer 32 is exposed through the through-hole 42T formed in the insulating layer 42. The N electrode frame 48E is formed on the portion of the N electrode contact layer 32 exposed through the through-hole 42T. A width w1 of the through-hole 42T may be equal to or greater than, for example, 20 μm, and may be greater than a width of the N electrode frame 48E. An adhesive layer 44 is disposed on the insulating layer 42. Due to the adhesive layer 44, an adhesive force between the insulating layer 42 and the P electrode bonding pad 46P, an adhesive force between the insulating layer 42 and the N electrode bonding pad 48P may be increased. The adhesive layer 44 may be, for example, a silicon oxide ($SiO_2$) layer.

Figure 3:
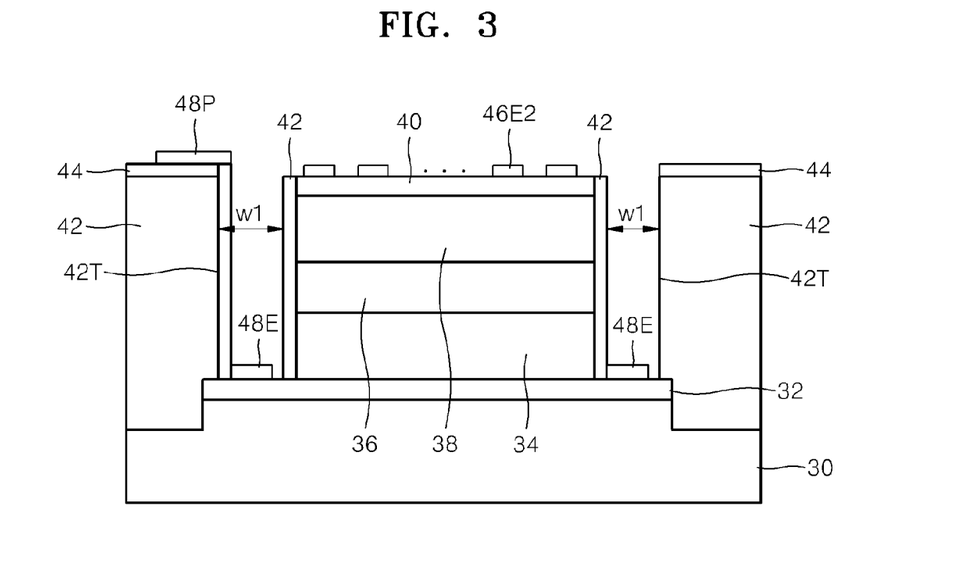
FIG. 3 is a cross-sectional view taken along line 3-3' of FIG. 1.

FIG. 3 is a cross-sectional view taken along line 3-3' of FIG. 1.

Referring to FIG. 3, the adhesive layer 44 is formed on a portion of the insulating layer 42 outside the through-hole 42T, and the N electrode pad 48P is formed on the adhesive layer 44. The N electrode frame 48E is extended along a side wall of the through-hole 42T to be connected to the N electrode pad 48P.

Figure 4:
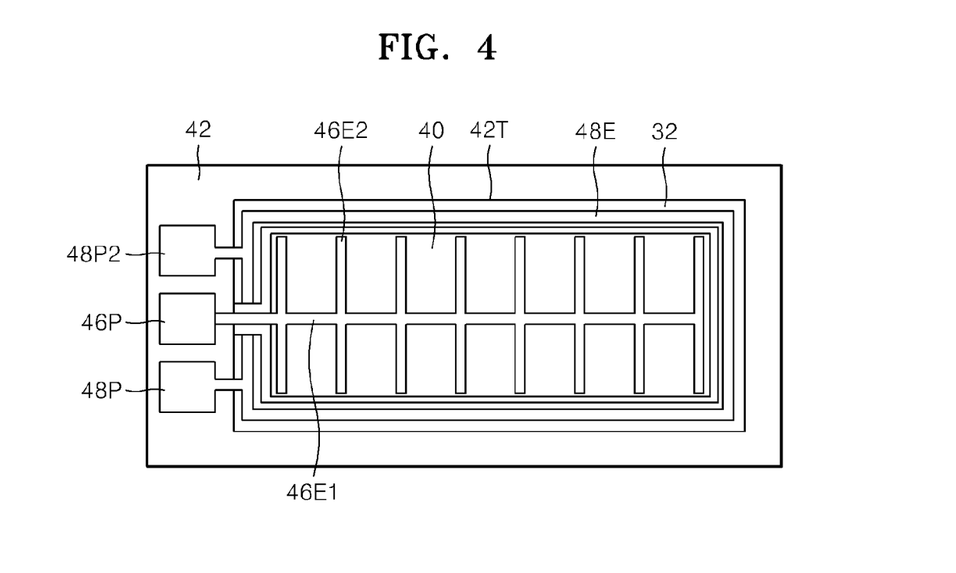
FIG. 4 is a plan view illustrating a case where the optical image modulator of FIG. 1 includes two P electrode pads.

Meanwhile, FIG. 4 is a plan view illustrating a case where the optical image modulator of FIG. 1 includes two P electrode pads. Referring to FIG. 4, the N electrode pad 48P (hereinafter, referred to as first N electrode pad) and a second N electrode pad 48P2 may be disposed on the insulating layer 42. A connection relationship between the second N electrode pad 48P2 and the N electrode frame 48E may be the same as that between the first N electrode pad 48P and the N electrode frame 48E. The first and second N electrode pads 48P and 48P2 may be disposed at both sides of the P electrode pad 46P.

According to simulation results, when the N electrode frame 48E exists, a frequency (hereinafter, referred to as a cut-off frequency) at which an intensity of output light is reduced to −3 dB ranges from 50 MHz to 60 MHz, but when the N electrode frame 48E does not exist, a cut-off frequency is less than 40 MHz, and a cut-off frequency is reduced to as low as 28 MHz according to regions.

Accordingly, if the N electrode frame 48E is disposed as shown in the optical image modulator of the present embodiment, a cut-off frequency is high (i.e., a frequency bandwidth is large), and a change in a cut-off frequency according to regions in the optical image modulator is small. Accordingly, the optical image modulator may operate at a high frequency of 40 MHz or more.

Figure 5:
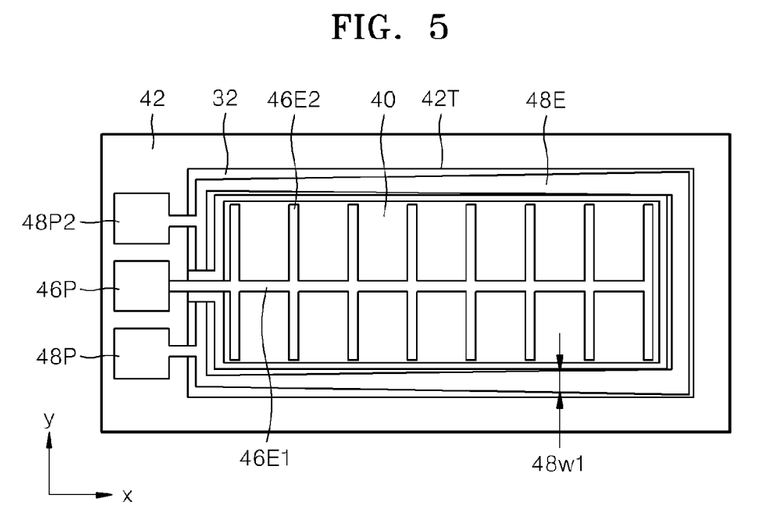
FIGS. 5 and 6 are plan views illustrating a case where an N electrode frame of the optical image modulator of FIG. 4 has a width that is increased farther away from an N electrode pad.
Figure 6:
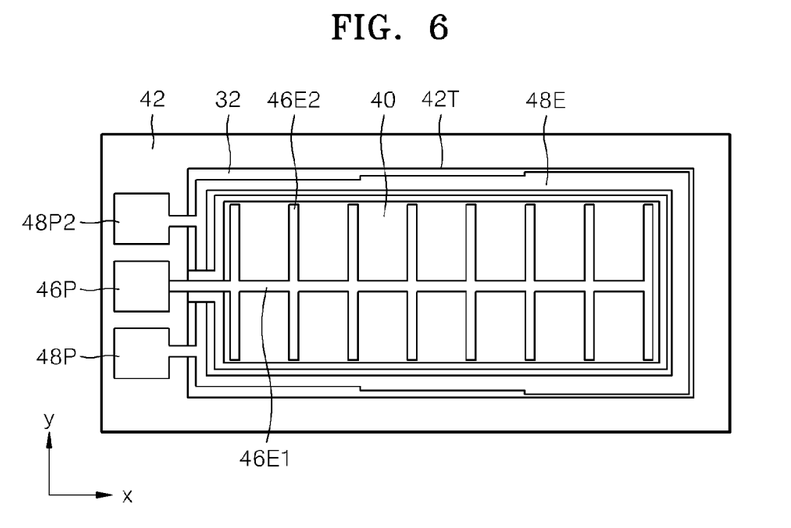

FIGS. 5 and 6 are plan views illustrating a case where the N electrode frame 48E of the optical image modulator of FIG. 4 is modified in order to increase electro-optic response uniformity according to regions of the optical image modulator.

In FIG. 5, the width $48w1$ of the N electrode frame 48E is increased farther away from the first and second N electrode pads 48P and 48P2. The width $48w1$ of the N electrode frame 48E may be increased continuously. Meanwhile, in FIG. 6, the width $48w1$ of the N electrode frame 48E is increased stepwise.

Referring to FIGS. 5 and 6, the width $48w1$ of the N electrode frame 48E may vary, for example, between 20 to 80 μm. As shown in FIGS. 5 and 6, if the width $48w1$ of the N electrode frame 48E of the optical image modulator is increased farther away in a y-axis direction from the first and second N electrode pads 48P and 48P2, a cross-sectional area of the N electrode frame 48E is increased, thereby reducing an electric resistance. Accordingly, if the width $48w1$ of the N electrode frame 48E is constant as shown in FIG. 1 or 4, a line resistance is increased as a length of the N electrode frame 48E is increased. However, if the width $48w1$ of the N electrode frame 48E is increased as shown in FIG. 5 or 6, the optical image modulator of FIG. 5 or 6 may compensate for the increased line resistance. Accordingly, the optical image modulator of FIG. 5 or 6 may prevent a cut-off frequency from being reduced in a region far from the first and second N electrode pads 48P and 48P2, thereby greatly reducing a change in a cut-off frequency according to regions of the optical image modulator.

If the width $48w1$ of the N electrode frame 48E is constant at 20 μm, an intensity of output light measured in first through fifth regions A1 through A5 of the optical image modulator at a given applied voltage frequency, for example, at a frequency of 40 MHz, is about 3 dB.

Meanwhile, when the width $48w1$ of the N electrode frame 48E is increased stepwise from 20 μm, to 50 μm, to 80 μm farther away from the first and second N electrode pads 48P and 48P2, an intensity of output light measured in the first through fifth regions A1 through A5 at the same given applied voltage frequency is about 1 dB.

Electro-optic response characteristics of the optical image modulator of FIG. 1 or 4 in which the width $48w1$ of the N electrode frame 48E is constant are superior to those of a conventional optical image modulator, and electro-optic response characteristics of the optical image modulator of FIG. 5 or 6 in which the width $48w1$ of the N electrode frame 48E is increased are superior to those of the conventional optical image modulator. In other words, frequency response uniformity according to regions of the optical image modulator of FIG. 1 or 4 are superior to those of the conventional optical image modulator, and frequency response uniformity of the optical image modulator of FIG. 5 or 6 are also superior to those of the conventional optical image modulator.

Figure 7:
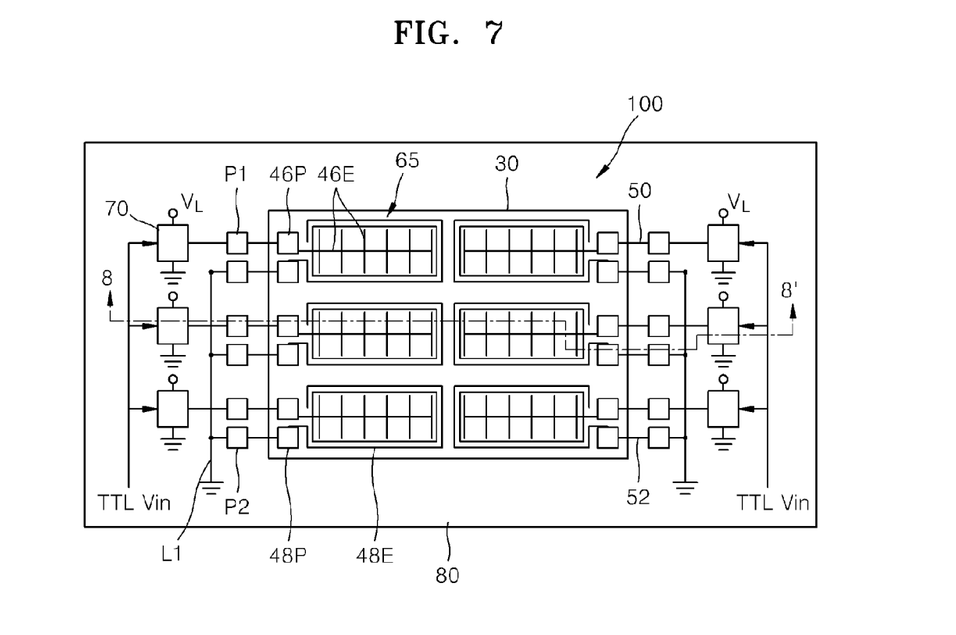
FIG. 7 is a plan view illustrating a large optical image modulator (i.e., an optical image modulator array) using a plurality of optical image modulators as unit optical image modulators, according to an embodiment.

FIG. 7 is a plan view illustrating a large optical image modulator (i.e., an optical image modulator array 100) using a plurality of optical image modulators as unit elements, according to an embodiment of the present invention.

The large optical image modulator having an area of 4 mm×3 mm to 8 mm×6 mm is divided into an array of unit optical image modulators each having a small area of, for example, 2 mm×1 mm or so, and the unit optical image modulators correspond to a plurality of driving elements in a one-to-one manner, to reduce a resistance and a capacitance of the large optical image modulator, drive the large optical image modulator at high speed, and increase frequency response uniformity. Also, in order to increase a light reflectance of the large optical image modulator, that is, in order to increase a fill factor, the P electrode 46E of each of the unit optical image modulators may be a transparent electrode.

Referring to FIG. 7, the optical image modulator array 100 includes a plurality of unit optical image modulators 65. Although each of the unit optical image modulators 65 is the optical image modulator of FIG. 1, the present embodiment is not limited thereto and each of the unit optical image modulators 65 may be the optical image modulator of FIG. 4, 5, or 6. The plurality of unit optical image modulators 65 are arranged in 2 columns and Y rows. Here, Y is an integer equal to or greater than 1. The number of rows (the value of Y) may be appropriately determined in consideration of an overall area of the optical image modulator array 100, an area of each of the unit optical image modulators, a fill factor, and so on. If it is accepted that a circuit may be complicated and frequency response uniformity between the unit optical image modulators 65 may be slightly reduced, the plurality of unit optical image modulators 65 may be arranged in more than 2 rows. Although the insulating layer and the through-hole formed in the insulating layer are not shown in FIG. 7 for convenience, the insulating layer is disposed between the plurality of unit optical image modulators 65, and the through-hole is formed in the insulating layer 42. At this time, the insulating layer may be the insulating layer 42 as shown in FIG. 1. The plurality of unit optical image modulators 65 are arranged on the substrate 30. The substrate 30 is mounted on a printed circuit board 80. The plurality of unit optical image modulators 65 are located between a plurality of driving elements 70 which are formed on the printed circuit board 80. If the unit optical image modulators 65 operate at a frequency of several tens of MHz, for example, 40 MHz or more, current more than 100 mA or more at the maximum may be generated. Hence, the plurality of driving elements 70 may be metal-oxide-semiconductor field-effect transistors (MOSFETs) which may be able to control current and generate a square wave. However, the driving elements 70 are not limited to MOSFETs. The plurality of driving elements 70 are arranged in 2 columns, that is, one column at either side of the plurality of unit optical image modulators 65, and the number of rows in each column is equal to the number of rows of the plurality of unit optical image modulators 65. As a result, the plurality of unit optical image modulators 65 correspond to the driving elements 70 in a one-to-one manner. Distances between the unit optical image modulators 65 and the driving elements 70 may be constant. First and second bonding pads P1 and P2 are disposed between each of the driving elements 70 and each of the unit optical image modulators 65. The first and second bonding pads P1 and P2 are formed on the printed circuit board 80. The first bonding pad P1 corresponds to the P electrode pad 46P of each of the unit optical image modulators 65. The second bonding pad P2 corresponds to the N electrode pad 48P of each of the unit optical image modulators 65. The distance between the first bonding pads P1 and the P electrode pad 46P may be the same as a distance between the second bonding pads P2 and the N electrode pad 48P. The first electrode pad P1 is connected to each of the driving elements 70. Accordingly, each of the driving elements 70 is connected to the P electrode pad 46P through the first electrode pad P1. The first and second N electrode pads 48P of the unit optical image modulators 65 are commonly connected to a grounded wire L1. The unit optical image modulators 65 may be collectively driven through the control of a low current voltage of a Transistor-Transistor Logic (TTL) level. With an input voltage of a TTL level TTL Vin, each of the driving elements 70 is turned on or off at a minimum bias voltage VL.

In FIG. 7, the unit optical image modulators 65 correspond to the independent driving elements 70 in a one-to-one manner. Accordingly, the unit optical image modulators 65 may be individually driven. Also, electric wires between the driving elements 70 and the unit optical image modulators 65 may be formed under the same conditions, to minimize a phase delay difference between the unit optical image modulators 65. As a result, the unit optical image modulators 65 may be collectively driven under the same conditions, and the unit optical image modulators 65 may operate at high speed and may have uniform frequency response characteristics. Accordingly, the optical image modulator array 100 having a large area may operate at high speed, and may have uniform frequency response characteristics according to regions.

Meanwhile, all wires such as signal lines and ground lines on the printed circuit board 80 are based on the design of a microstrip or a coupler with 50Ω. Also, perpendicularly bent portions of the electric wires on the printed circuit board 80 are rounded to minimize radio frequency (RF) loss. If multiple driving elements in which a plurality of MOSFETs are installed are used, since lengths of wires between the driving elements and the unit optical image modulators are different from one another, tuning may be performed to achieve the same electric driving conditions by adding a time delay element to compensate for the difference (for example, by increasing lengths of wires in a convex-concave shape).

Figure 8:
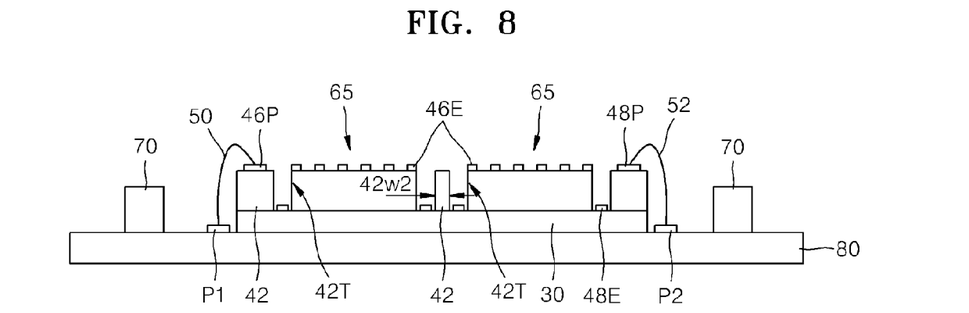
FIG. 8 is a cross-sectional view taken along line 8-8' of FIG. 7.

FIG. 8 is a cross-sectional view taken along line 8-8' of FIG. 7.

Referring to FIG. 8, the P electrode pad 46P and the first bonding pad P1 are bonded to each other by using a first wire 50. The N electrode pad 48P and the second bonding pad P2 are bonded to each other by using a second wire 52. Each of the unit optical image modulators 65 is surrounded by the insulating layer 42, and the contact hole 42T is formed between the insulating layer 42 and the unit optical image modulator 65. Although the N electrode frame 48E formed in the through-hole 42T is formed on the N electrode contact layer 32, the N electrode contact layer 32 is not shown in FIG. 7 for convenience. A width 42w2 of the insulating layer 42 formed between the unit optical image modulators 65 may be, for example, 100 μm. The driving elements 70 and the first and second bonding pads P1 and P2 are connected to each other through wires (not shown) formed on the printed circuit board 80.

FIGS. 9 through 14 are cross-sectional view illustrating a method of manufacturing an optical image modulator having a PIN diode structure, according to an exemplary embodiment. The same elements are denoted by the same reference numerals and an explanation thereof will not be given.

Figure 9:
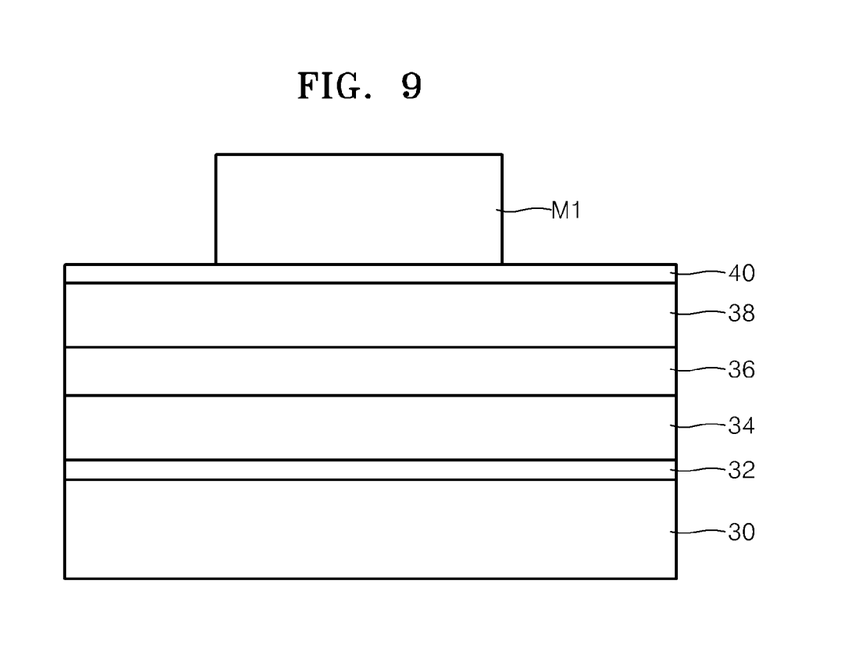
FIGS. 9 through 14 are cross-sectional views illustrating a method of manufacturing an optical image modulator, according to an embodiment.
Figure 10:
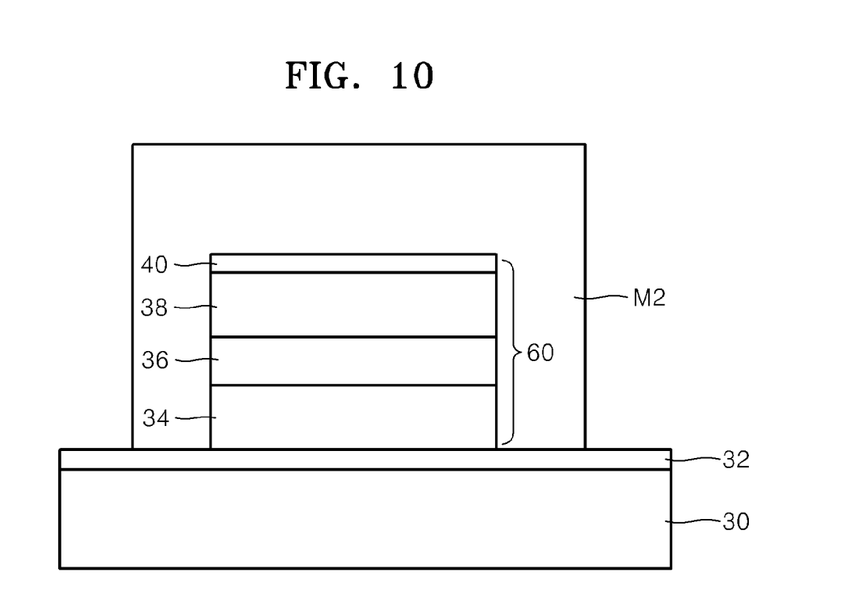

Referring to FIG. 9, the N electrode contact layer 32 is formed on the substrate 30. The lower DBR layer 34, the quantum well layer 36, the upper DBR layer 38, and the P electrode contact layer 40 are sequentially stacked on the N electrode contact layer 32. The lower DBR layer 34, the quantum well layer 36, the upper DBR layer 38, and the P electrode contact layer 40 may be stacked by using, for example, epitaxial growth. When the N electrode contact layer 32 and the lower DBR layer 34 are formed, n-doping may be performed. The upper DBR layer 38 and the P electrode contact layer 40 may be p-doped. A mask M1 is formed on the P electrode contact layer 40. The mask M1 may be a photosensitive pattern. The PIN diode structure layer 60 is defined by the mask M1. After the mask M1 is formed, the P electrode contact layer 40, the upper DBR layer 38, the quantum well layer 36, and the lower DBR layer 34 are sequentially etched by using the mask M1 as an etching mask, until a portion of the N electrode contact layer 32 is exposed. After the etching, the mask M1 is removed. After the etching, as shown in FIG. 10, the PIN diode structure layer 60 is formed on the substrate 30. The PIN diode structure layer 60 may include the N electrode contact layer 32.

Figure 11:
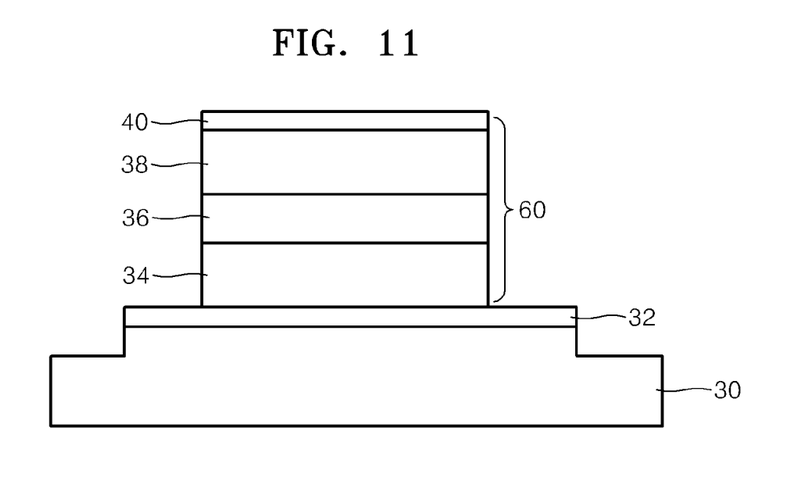

Referring to FIG. 10, a mask M2 is formed on the N electrode contact layer 32 to cover the PIN diode structure layer 60 and partially cover the N electrode contact layer 32. Next, the N electrode contact layer 32 is etched by using the mask M2 as an etching mask. The etching may be performed until a top surface of the substrate 30 is exposed and then a part of the substrate 30 is removed. Next, the mask M2 is removed. After the etching, as shown in FIG. 11, a stepped portion is formed between the substrate 30 and the N electrode contact layer 32.

Figure 12:
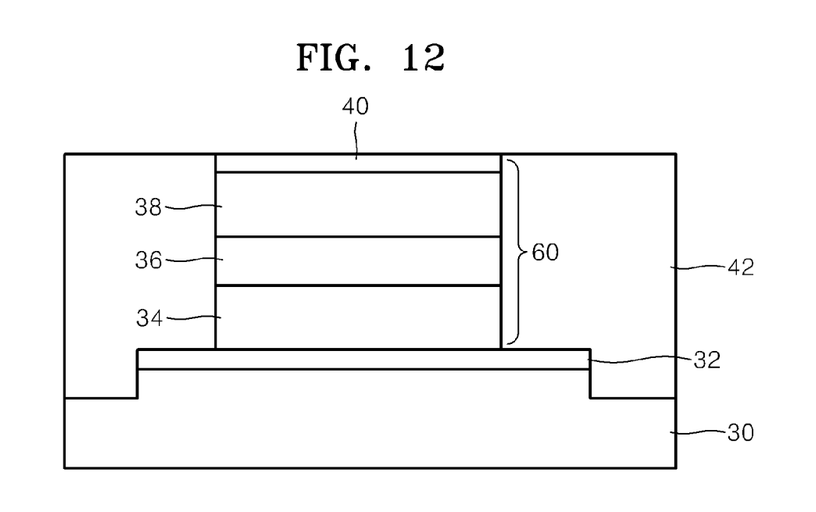

Next, referring to FIG. 12, the insulating layer 42 is formed on the substrate 30 to surround the PIN diode structure layer 60 and cover the N electrode contact layer 32. The insulating layer 42 may be formed by forming an insulating material to cover the PIN diode structure layer 60 and planarizing the insulating material until the P electrode contact layer 40 is exposed.

Figure 13:
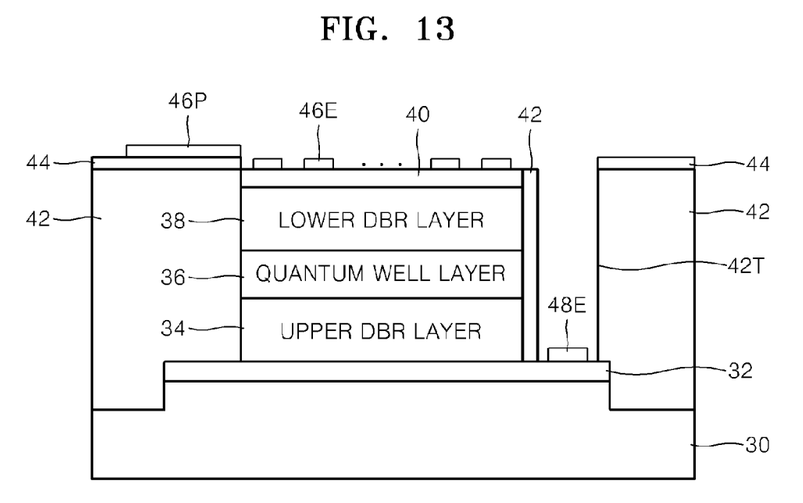
Figure 14:
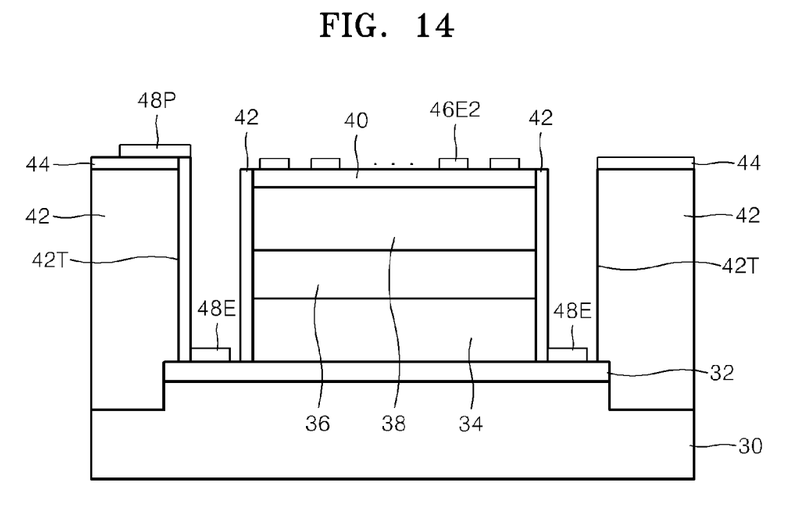

Next, referring to FIGS. 13 and 14, the through-hole 42T through a portion of the N electrode contact layer 32 is exposed is formed in the insulating layer 42. FIG. 13 is a cross-sectional view taken along line 2-2' of FIG. 1. FIG. 14 is a cross-sectional view taken along line 3-3' of FIG. 1. Distributions of the through-hole 42T shown in FIGS. 13 and 14 may be different from each other.

After the through-hole 42T is formed, the adhesive layer 44 is formed on a top surface of the insulating layer 42. Next, referring to FIG. 13, the P electrode pad 46P is formed on the adhesive layer 44, and the P electrode 46E having a fishbone shape is formed on the P electrode contact layer 40. Next, referring to FIG. 14, the N electrode pad 48P is formed on the adhesive layer 44, and the N electrode frame 48E is formed on the portion of the N electrode contact layer 32 exposed through the through-hole 42T.

In this case, the N electrode pad 48P and the N electrode frame 48E are connected to each other by forming a material used to form the N electrode frame 48E even on a side wall of the through-hole 42T between the N electrode pad 48P and the N electrode pad 48E. As a result, the N electrode frame 48E is extended along the side wall of the through-hole 42T to contact the N electrode pad 48P. Accordingly, the optical image modulator including the N electrode frame 48E that surrounds the PIN diode structure layer 60 is completed. The unit optical image modulators 65 constituting the optical image modulator array 100 of FIG. 7 may be formed by the method of FIGS. 9 through 14. Accordingly, the method of FIGS. 9 through 14 may be used to manufacture the optical image modulator array 100 of FIG. 7.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. An optical image modulator comprising:
   a substrate;
   an N electrode contact layer formed on the substrate;
   a lower distributed Bragg reflection (DBR) layer formed on the N electrode contact layer;
   a quantum well layer formed on the lower DBR layer;
   an upper DBR layer formed on the quantum well layer;
   a P electrode contact layer formed on the upper DBR layer;
   a P electrode formed on the P electrode contact layer; and
   an N electrode formed on the N electrode contact layer,
   wherein the N electrode is a frame that surrounds the lower DBR layer.

2. The optical image modulator of claim 1, wherein the P electrode and the N electrode are respectively connected to a P electrode bonding pad and an N electrode bonding pad, and the P electrode bonding pad and the N electrode bonding pad are arranged in the same direction to be parallel to each other.

3. The optical image modulator of claim 2, further comprising a second N electrode bonding pad connected to the N electrode,
   wherein the N electrode bonding pad and the second N electrode boding pad are symmetric to each other about the P electrode bonding pad.

4. The optical image modulator of claim 1, wherein the P electrode is formed in a fishbone pattern or a matrix pattern.

5. The optical image modulator of claim 1, further comprising an insulating layer that surrounds the N electrode contact layer, the lower DBR layer, the quantum well layer, the upper DBR layer, and the P electrode contact layer,
   wherein a through-hole through which a portion of the N electrode contact layer is exposed is formed in the insulating layer,
   wherein the N electrode is formed on the portion of the N electrode contact layer exposed through the through-hole.

6. The optical image modulator of claim 5, wherein an N electrode pad and a P electrode pad are arranged in the same direction on the insulating layer, and the N electrode is extended along a side wall of the through-hole to be connected to the N electrode.

7. The optical image modulator of claim 1, wherein the N electrode surrounds at least one side of the lower DBR layer.

8. The optical image modulator of claim 1, wherein a width of the N electrode is increased farther away from a point where a voltage of the N electrode is applied.

9. The optical image modulator of claim 8, wherein the width of the N electrode is increased continuously.

10. The optical image modulator of claim 8, wherein the width of the N electrode is increased stepwise.

11. An optical image modulator array comprising:
    an array of unit optical image modulators; and
    a plurality of driving elements that control driving voltages applied to the unit optical image modulators,
    wherein each of the unit optical image modulators is the optical image modulator of claim 1.

12. The optical image modulator array of claim 11, wherein the unit optical image modulators are arranged in 2 columns and in Y rows (Y=1, 2, 3, . . . ).

13. The optical image modulator array of claim 12, wherein the plurality of driving elements are arranged in 2 columns, that is, one column at either side of the plurality of unit optical image modulators, and the number of rows in each of the 2 columns is equal to the number of rows of the unit optical image modulators.

14. The optical image modulator array of claim 12, wherein the driving elements are metal-oxide-semiconductor field-effect transistors (MOSFETs).

15. The optical image modulator array of claim 11, wherein the plurality of driving elements correspond to the unit optical image modulators in a one-to-one manner.

16. The optical image modulator array of claim 15, wherein lengths of electric wires between the driving elements and the unit optical image modulators are the same.

17. A method of manufacturing an optical image modulator, the method comprising:
    forming an N electrode contact layer on a substrate;
    sequentially stacking a lower DBR layer, a quantum well layer, an upper DBR layer, and a P electrode contact layer on the N electrode contact layer;
    forming a mask on a portion of the P electrode contact layer;
    sequentially etching in reverse order the lower DBR layer, the quantum well layer, the upper DBR layer, and the P electrode contact layer by using the mask as an etching mask until a portion of the N electrode contact layer is exposed;
    removing the mask;
    forming an insulting layer on the substrate to cover the exposed portion of the N electrode contact layer and to cover side surfaces of the lower DBR layer, the quantum well layer, the upper DBR layer, and the P electrode contact layer;
    forming a through-hole in the insulating layer to expose a portion of the N electrode contact layer and to surround the lower DBR layer; and
    forming a P electrode on the P electrode contact layer, and forming an N electrode on the portion of the N electrode contact layer exposed through the through-hole to surround the lower DBR layer.

18. The method of claim 17, wherein the forming of the P electrode and the N electrode comprises forming on the insulating layer a P electrode bonding pad to be connected to the P electrode and an N electrode bonding pad to be connected to the N electrode,
    wherein the P electrode bonding pad and the N electrode bonding pad are formed in the same direction to be parallel to each other.

19. The method of claim 18, wherein the N electrode has a width that is increased farther away from the N electrode bonding pad.

20. The method of claim 19, wherein the width of the N electrode is increased continuously.

21. The method of claim 19, wherein the width of the N electrode is increased stepwise.

22. The method of claim 17, wherein the P electrode is formed in a fishbone pattern or a matrix pattern.

23. The method of claim 18, wherein one or two N electrode bonding pads are used.

* * * * *